United States Patent [19]

Feldman et al.

[11] 4,313,254

[45] Feb. 2, 1982

[54] THIN-FILM SILICON SOLAR CELL WITH METAL BORIDE BOTTOM ELECTRODE

[75] Inventors: Charles Feldman, Washington, D.C.; Harry K. Charles, Baltimore; Frank G. Satkiewicz, Ellicott City, both of Md.

[73] Assignee: The Johns Hopkins University, Baltimore, Md.

[21] Appl. No.: 174,739

[22] Filed: Aug. 4, 1980

Related U.S. Application Data

[62] Division of Ser. No. 89,496, Oct. 30, 1979.

[51] Int. Cl.³ ............................................. H01L 31/18
[52] U.S. Cl. ...................................... 29/572; 136/258; 148/174; 148/187; 148/191; 357/30; 357/65; 427/74
[58] Field of Search ............................ 29/572; 427/74; 136/256, 258, 261; 352/30, 65, 67, 71; 148/174, 186, 187, 188, 189, 191

[56] References Cited

U.S. PATENT DOCUMENTS 3,914,856 10/1975 Fang ........................................ 29/572
4,113,532 9/1978 Authier et al. ........................ 148/174

OTHER PUBLICATIONS

C. Feldman et al., "Vacuum Deposited Polycrystalline Silicon Solar Cells", Conf. Record, 12th IEEE Photovoltaic Specialists Conf. (1976), pp, 100-105.
C. Feldman et al., "Evaluation of Vacuum Deposited Silicon Films & Junctions for Solar Cell Applications", Proc. Nat'l. Workshop on Low Cost Polycrystalline Silicon Solar Cells, May 1976, Dallas, Texas, pp. 267-291.
H. K. Charles et al., "p-n Junctions in Vacuum Deposited Polycrystalline Silicon Thin Films", IEDM Tech. Digest, pp. 71-74 (1976).
C. Feldman et al., "Evaporated Polycrystalline Silicon Films for Photovoltaic Applications-Grain Size Effects," J. Electronic Materials, vol. 7, pp. 309-336 (1978).
C. Feldman et al., "Vacuum Deposited Polycrystalline Silicon Solar Cells for Terrestrial Use", Conf. Record, 14th IEEE Photovoltaic Specialists Conf. (1980), pp. 391-396.

Primary Examiner—Aaron Weisstuch
Attorney, Agent, or Firm—Robert E. Archibald

[57] ABSTRACT

The invention relates to an improved thin film semiconductor p-n junction device and its method of fabrication, utilizing vacuum deposition techniques, whereby continuous/batch processing may be utilized, capable of mass producing p-n junction devices; e.g. solar cells, with large surface areas and good operating efficiency and at low cost. A novel feature of the proposed device and its method of fabrication is the formation of the bottom electrode of the device, located between the nonconducting substrate and the overlying silicon semiconductor layer, as a metal boride region which possesses several characteristics particularly necessary to the fabrication of thin film silicon solar cells for example, having improved structural and operating properties, as well as good operating efficiency.

11 Claims, 2 Drawing Figures

THIN-FILM SILICON SOLAR CELL WITH METAL BORIDE BOTTOM ELECTRODE

STATEMENT OF GOVERNMENTAL INTEREST

The Government has rights in this invention pursuant to Contract No. N00024-78C-5384 awarded by the Department of the Navy.

This application is a division of application Ser. No. 089,496, filed Oct. 30, 1979.

BACKGROUND OF THE INVENTION

A vast amount of research and development work is currently underway, aimed at producing solar cells which are capable of being fabricated at low cost and with large operating surface area for a variety of applications both as a primary and secondary power source. In particular, solar cells fabricated from thin film polycrystalline silicon, utilizing vacuum deposition techniques, have previously been investigated as one possible approach to achieving the desired goal of low-cost solar cells which might be fabricated with large operating surface areas. One particular problem associated with such proposed thin film silicon solar cell fabrication, however, is the attainment of a suitable "bottom" electrode disposed between the silicon thin film and a nonconducting substrate and possessing the operating and structural characteristics which permit the growth of large silicon crystallites, for improved operating efficiency; which does not react adversely to silicon, in order to prevent the formation of some silicides that adversely affect operational and structural characteristics of the cell; and, which have a thermal expansion coefficient similar to that of the adjacent silicon thin film, for improved adhesion properties.

SUMMARY OF THE INVENTION

The above-mentioned problem of attaining a suitable bottom electrode between the silicon thin film and the nonconducting substrate is solved, in accordance with the novel method and apparatus of the present invention, by forming a layer of suitable metal boride between the substrate and the overlying silicon thin film. Thus, it has been discovered that metal borides, formed in accordance with the present invention, can be utilized as an effective bottom electrode and, moreover, possess operating and structural characteristics amenable to the mass production of silicon solar cells (and similar p-n junction devices) by continuous/batch processing, utilizing vacuum deposition techniques, and thus render attainable low-cost, thin film silicon solar cells having relatively large operating surface area and improved operating efficiency.

One object of the present invention is thus to provide a structure and method of fabrication for a low-cost, efficient thin film silicon p-n junction device, such as a solar cell.

A more specific object of the present invention is the attainment of an effective bottom electrode means disposed between a nonconducting substrate and an overlying polycrystalline silicon thin film, fabricated utilizing vacuum deposition techniques and possessing operating and structural characteristics particularly amenable to continuous or batch process production of thin film silicon solar cells and like p-n junction devices.

Other objects, purposes and characteristic features of the present invention will in part be pointed out as the description of the present invention progresses and in part be obvious from the accompanying drawings wherein:

FIG. 1 is a simplified view of a solar cell structure embodying the present invention; and, FIG. 2 is a block diagram of a continuous fabrication method, proposed in accordance with the present invention, for fabricating the solar cell structure of FIG. 1.

DESCRIPTION OF THE ILLUSTRATED EMBODIMENT

Figure 1:
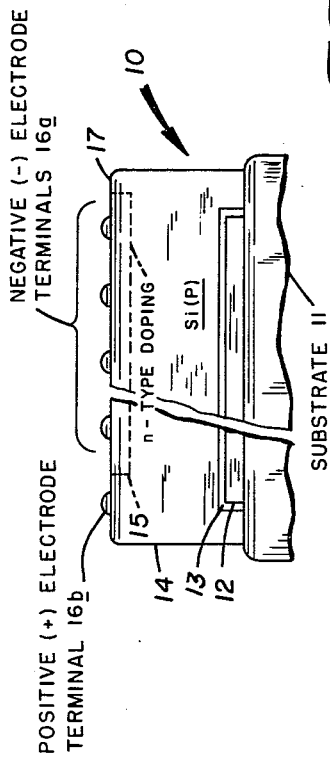

In accordance with the present invention, the proposed solar cell structure shown at 10 in FIG. 1 is fabricated, by vacuum deposition, on a substrate 11 of suitable material, such as for example sapphire, glass, graphite, ceramic (such as alumina) or fused silica. A layer 12 of titanium (Ti) or similar transition metal (e.g. zirconium (Zr), tantalum (Ta) and chromium (Cr) is first deposited on the substrate 11, followed by an overlying boron (B) film 13 which upon heating combines with the transition metal, to form a metal boride layer (e.g. $TiB_2$) approximately 1 $\mu m$ in thickness that serves as the bottom electrode of the solar cell. The deposited boron (B) film 13 may if desired be of sufficient thickness to result in excess boron (B) which can be diffused into a subsequently deposited overlying silicon (Si) film 14 to form p-type silicon (Si).

The Si layer 14 is approximately 10-30 $\mu m$ in thickness and might be formed, for example, by co-depositing Si and B to yield a p-type silicon semiconductor layer 14, with the amount of boron (B) adjusted to produce a somewhat more dense doping near the bottom ($TiB_2$) electrode if desired.

A region 15 of n-type Si is then formed on top of the p-type Si completing the p-n junction for the cell. A top metal electrode terminal assembly 16a-b, e.g. of well-known finger configuration, is then fabricated on top of the cell structure by conventional masking techniques for example and, finally, a standard antireflective oxide coating 17 is applied to maximize solar energy admittance into the cell. As shown in FIG. 1, electrical connection to the bottom ($TiB_2$) electrode region may be made, if desired, directly to the silicon (Si) film 14, at terminal 16b, by sufficiently doping the Si film 14 with boron (B). Electrical connection may also be made by appropriate masking to leave a portion of the $TiB_2$ uncoated with silicon during fabrication.

Figure 2:
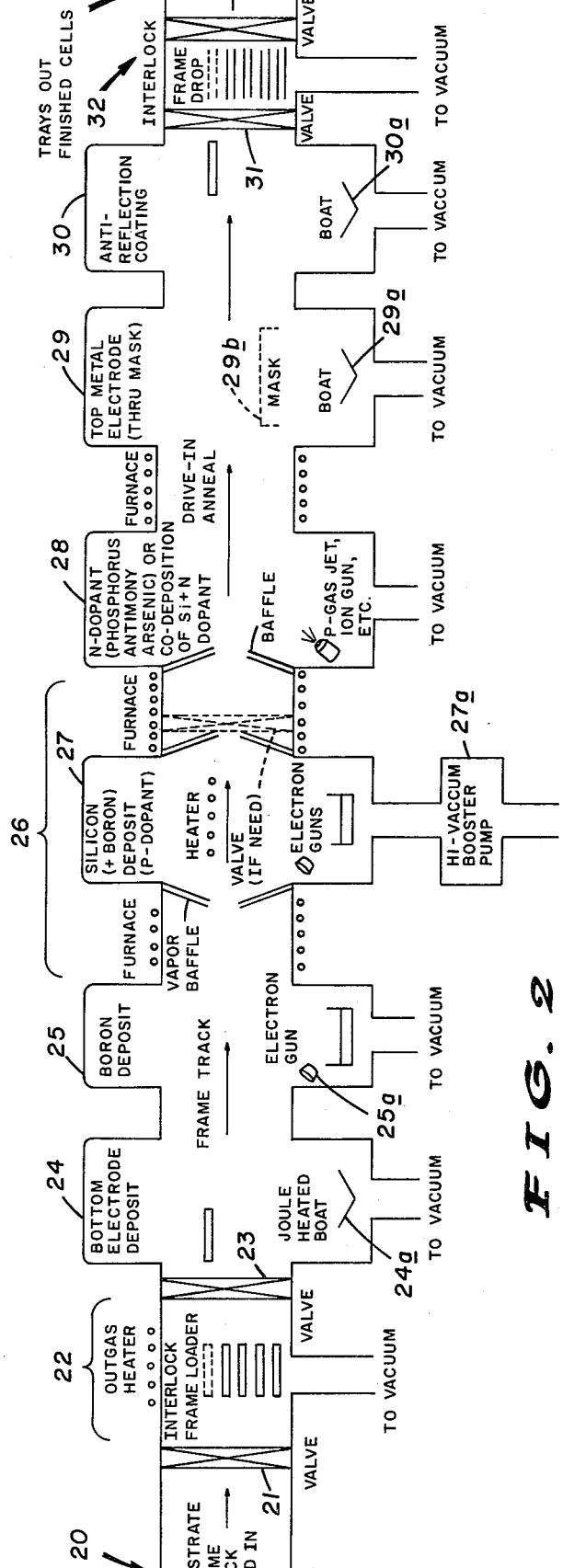

FIG. 2 of the drawings illustrates, in block diagram form, one embodiment for an automated vacuum deposition process implementing the proposed fabrication method for producing the proposed solar cell units, in accordance with the present invention. Preferably, in order to maintain purity particularly during the deposition of silicon (Si), each deposition would be carried out in an individual vacuum chamber, with the series of vacuum chambers connected together by appropriate tubing. A track (or tracks) of appropriate width to carry the substrate material, without interfering with the vapor deposition processes, runs through the various illustrated deposition stations and the interconnecting tubes. Depending upon the requirements of practice, the proposed fabrication method and system of the present invention can be operated in either a batch processing or in a continuous flow mode.

Generally speaking, loading of the unprocessed substrates and unloading of the completed cells would be accomplished through the use of suitable frames, e.g.

containing clean substrate stacked in appropriate holders at the input (left-hand in FIG. 2) end of the fabrication process and inserted into the vacuum system through appropriate vacuum interlocks; with the frames placed on the transport track to be carried to the successive deposition stations by automatic mechanical drive arrangements of any suitable design. Preferably also, the loading and unloading of the substrates is accomplished in a manner permitting operation of the fabrication facility for relatively long periods without breaking the vacuum and thereby avoiding the necessity for frequent outgassing of the system.

The illustrated embodiment of the fabrication system for implementing the proposed fabrication method of the present invention thus comprises a suitable feed 20 at its left-hand or input end, at which the clean substrate material is supplied to the vacuum system through a valve station 21. The initial vacuum station 22 is connected to a suitable source of vacuum (not shown) and comprises: an outgas heater; appropriate vacuum interlock arrangement; and, a mechanism for receiving the incoming substrate stack and loading the substrates into the transport frame structures. As mentioned previously, various substrate materials, such as fused silica, sapphire, glass, graphite, ceramic, may be utilized having a capability of withstanding high temperature processing within the range of 900 to 1300 degrees centigrade, in accordance with the present invention.

After loading, the substrate-carrying frames are subsequently transported through valve station 23 to vacuum stations 24 and 25, in succession, to form the bottom (metal boride) conducting electrode, as previously described. More particularly, the vacuum station 24 includes a Joule heated boat 24a, for example, by means of which a layer of suitable transition metal, such as titanium (Ti), zirconium (Zr), tantalum (Ta) or chromium (Cr), is vacuum deposited onto the substrate material. Subsequently, at the vacuum station 25, an electron gun 25a, for example, is utilized for vacuum depositing a layer of boron (B) over the transition metal.

The next station 26 in the fabrication process illustrated in FIG. 2 comprises a suitable furnace which initially heats the substrate 11 and its layers 12 and 13 in either a vacuum or in an inert gas (such as helium or argon) to form the metal boride (e.g. $TiB_2$) bottom electrode layer. By way of example, the furnace of station 26 might heat the cell material at 900° C. for approximately fifteen to thirty minutes, in order to form the metal boride layer, up to a maximum of one hundred twenty minutes depending upon the requirements of practice.

Subsequently, the partially processed substrates enter station 27 where the p-type silicon (Si) deposition step occurs. It should be noted that additional vacuum pump capability 27a is provided in order to achieve lower pressures at station 27. In the illustrated embodiment, the Si thin film layer 14 is vacuum deposited at a substrate temperature of between 900 and 1300 degrees centrigrade (in furnace 26) and at a rate between 500 and 5000 Angstroms per minute, to a thickness of between 10 and 30 $\mu$m. During the deposition of silicon, at station 27, boron (B) may, if desired, be deposited simultaneously to achieve p-type doping; e.g. to a density of between $10^{17}$–$10^{19}$ atoms of B per cubic centimeter of Si. It has been observed in practice that controlling this doping with B, at station 27, so that it is more concentrated near the back or bottom electrode region, has the effect of improving device efficiency.

Following the vacuum deposition of the p-type silicon, at 27, an n-type dopant material is deposited, at station 28, to form the p-n junction within the cell. By way of examples, the n-type dopant applied at 28 might be phosphorus, antimony or arsenic. Phosphorus, for example, could be added either by use of a small gaseous jet applied close to the substrates, by evaporation from a low temperature source, or by ion implantation. Silicon may alternately be co-deposited with the dopant to form an n-type silicon layer.

Following the n-type doping step, at 28, the cell is transported to station 29 where the top metal electrode terminal assemblies 16a–16b are applied, utilizing standard masking technique involving the evaporation boat 29a and a suitable mask 29b. As shown in FIG. 1, the electrode terminals are preferably configured to minimize light interference, i.e. as a plurality of negative polarity electrode terminals in contact with the n-type silicon region 15 and a positive electrode terminal which connects electrically to the metal boride ($TiB_2$) bottom electrode region directly through the p-type Si thin film.

Subsequently, stage 30, a standard anti-reflective (oxide) coating is vacuum-deposited from boat 30a to maximize the light energy admittance of the completed solar cells. At the output of the station 30, the completed solar cells are fed, through valve station 31, to a final stage 32 where the finished cells are removed automatically from the transport frames and output from the vacuum system through appropriate interlock.

It should be understood at this time that the various chambers or stations illustrated in the block diagram of FIG. 2 may, if desired, be operated at different pressures and at different degrees of contamination through the use of appropriate isolation ports and baffles. Moreover, the frames carrying the substrates may, if desired, be constructed so that their ends mate with the baffles providing shielding between the various stages. Also, the length of the tubulation interconnecting the various vacuum chambers can be varied to allow time for annealing, diffusion, and driving stages before the samples reach the next vacuum deposition step. Since silicon (Si) deposition will require the longest time, multiple deposition stations which are positioned in line or in parallel could be used, if desired, to increase the efficiency of the over-all fabrication process.

Various other modifications, adaptations and alterations of the present invention are of course possible in light of the above teachings. It should therefore be understood at this time that the invention defined by the appended claims may be practiced otherwise than as specifically described hereinabove.

What is claimed is:
1. A method for producing a thin film p-n junction device comprising the steps of:
   vacuum depositing a first layer of transition metal on an electrically nonconducting substrate material,
   vacuum depositing a second layer of boron (B) overlying said first layer,
   heating the materials at a temperature and for a time sufficient to cause the transition metal and the (B) to form a transition metal boride layer,
   vacuum depositing p-type silicon (Si) on said transition metal boride layer at a substrate temperature between 900°–1300° centigrade and at a rate between 500–5000 Angstroms per minute to a thickness of between 10–30 $\mu$m, doping the (Si) with an n-type material to form a p-n junction, and attaching separate electrode means to said n-type material and said metal boride layer respectively.

2. The method specified in claim 1 wherein (B) is deposited in a layer of sufficient thickness to create an excess of (B) upon the formation of the metal boride region, said excess (B) diffusing into the (Si) to produce p-type (Si).

3. The method specified in claim 1 further including the additional step of depositing (B) simultaneously with the (Si) to achieve p-type doping of the (Si).

4. The method specified in claim 3 wherein the additional step of depositing (B) dopes the (Si) to approximately $10^{17}$–$10^{19}$ atoms of (B) per cubic centimeter of (Si).

5. The method of claim 3 wherein the additional step of depositing (B) simultaneously with the (Si) is controlled to produce a more concentrated deposition of (B) adjacent the metal boride layer.

6. The method of claim 1 wherein the step of doping the (Si) with an n-type material comprises subjecting the (Si) to phosphorous (P) from a gaseous source.

7. The method specified in claim 1 wherein the n-type (Si) material is formed by simultaneous deposition of (Si) and said n-type dopant.

8. The method specified in claim 1 wherein the electrode means are configured to produce minimum interference to light impinging upon the device and further including the additional step of vacuum depositing an anti-reflective coating to maximize light entering the device.

9. The method specified in claim 1 wherein the step of heating the materials to form the metal boride region is conducted at approximately 900° C. for between fifteen and one hundred twenty minutes in a vacuum or an inert gas.

10. A method of producing a thin film semiconductor p-n junction device comprising the steps of:

forming on an electrically nonconductive substrate material a first electrode means comprising a layer of transition metal boride by vacuum depositing separate layers of said transition metal and boron (B) and reacting said layers for a time sufficient to form said transition metal boride layer, vacuum depositing on the thus formed transition metal boride layer a bottom layer of silicon doped to create one type majority carrier, forming on said bottom layer of silicon a top layer of silicon doped to create the opposite type of majority carrier, forming a second electrode means connected to said top silicon layer, and connecting separate terminal means to said second electrode means and said transition metal boride layer respectively.

11. The method specified in claim 10 wherein said bottom silicon layer comprises p-type silicon and said top layer of silicon comprises n-type silicon.

* * * * *

UNITED STATES PATENT AND TRADEMARK OFFICE
CERTIFICATE OF CORRECTION

PATENT NO. : 4,313,254
DATED : February 2, 1982
INVENTOR(S) : C. Feldman, H.K. Charles, F.G. Satkiewicz It is certified that error appears in the above—identified patent and that said Letters Patent is hereby corrected as shown below:

On the title page, Item [54] should read:

--METHOD FOR FABRICATING A THIN-FILM SILICON SOLAR CELL WITH METAL BORIDE BOTTOM ELECTRODE--

Signed and Sealed this

Thirteenth Day of July 1982

[SEAL]

Attest:

Attesting Officer

GERALD J. MOSSINGHOFF
*Commissioner of Patents and Trademarks*